United States Patent
Palit et al.

(10) Patent No.: US 10,674,263 B1
(45) Date of Patent: Jun. 2, 2020

(54) SPEAKER EXCURSION PROTECTION

(71) Applicant: TEXAS INSTRUMENTS INCORPORATED, Dallas, TX (US)

(72) Inventors: Supriyo Palit, Kolkata (IN); Abhishek Singh, Bhojpur (IN); Kevin Selva Prasanna Valanarasu, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/402,509

(22) Filed: May 3, 2019

(30) Foreign Application Priority Data

Dec. 11, 2018 (IN) .............................. 201841046810

(51) Int. Cl.
*H04R 3/00* (2006.01)
*H03G 3/30* (2006.01)
*H03F 3/181* (2006.01)

(52) U.S. Cl.
CPC ............. *H04R 3/007* (2013.01); *H03F 3/181* (2013.01); *H03G 3/3005* (2013.01)

(58) Field of Classification Search
CPC ....... H04R 29/001; H04R 3/007; H04R 3/002
USPC ............................................ 381/55, 59, 349
See application file for complete search history.

(56) References Cited

U.S. PATENT DOCUMENTS

| 8,837,763 | B1 * | 9/2014 | Millen | H04R 1/2834 181/145 |
| 2015/0340795 | A1 * | 11/2015 | Lee | G06F 1/1656 381/334 |
| 2016/0157015 | A1 * | 6/2016 | Van Schyndel | H04R 3/007 381/55 |
| 2018/0160228 | A1 * | 6/2018 | Hu | H04R 3/007 |

OTHER PUBLICATIONS

Thiele, A.N. "Loudspeakers in Vented Boxes: Part I," Journal of the Audio Engineering Society, vol. 19, No. 5, May 1971, pp. 382-392.
Thiele, A.N. "Loudspeakers in Vented Boxes: Part II," Journal of the Audio Engineering Society, vol. 19, No. 5, May 1971, pp. 382-392.

(Continued)

*Primary Examiner* — Alexander Krzystan
(74) *Attorney, Agent, or Firm* — John R. Pessetto; Charles A. Brill; Frank D. Cimino

(57) ABSTRACT

An audio circuit includes an amplifier, a voltage sensor, a current sensor, and an excursion control circuit. The voltage sensor is coupled to an output of the amplifier. The current sensor is coupled to the output of the amplifier. The excursion control circuit is coupled to the amplifier, the voltage sensor, and the current sensor. The excursion control circuit includes back electro-magnetic force (EMF) measurement, a back-EMF model, and excursion protection. The back-EMF measurement is to measure back electro-magnetic force of a speaker based on voltage measurements received from the voltage sensor and current measurements received from the current sensor. The back-EMF model is updated based on measurements of the back-EMF and is converted to an excursion model. The excursion protection is to limit amplitude of audio signal provided to the amplifier based on the excursion model of the speaker and amplitude of an audio input signal.

4 Claims, 4 Drawing Sheets

(56) References Cited

OTHER PUBLICATIONS

Small, Richard. "Direct-Radiator Loudspeaker System Analysis," IEEE Transactions on Audio and Electroacoustics, vol. AU-19, No. 4, Dec. 1971, pp. 269-281.
Small, Richard. "Vented-Box Loudspeaker Systems Part I: Analysis," Journal of the Audio Engineering Society, vol. 21, No. 5, Jun. 1973, pp. 363-372.
Nomura, Y. and Kitamura, Z. "An Analysis of Design Conditions for Phase-Inverter Speaker System with a Drone Cone," IEEE Transactions on Audio and Electroacoustics, vol. AU-21, No. 5, Oct. 1973, pp. 397-407.
Small, Richard. "Passive Radiator Loudspeaker Systems Part I: Analysis," Journal of the Audio Engineering Society, vol. 22, No. 8, Oct. 1974, pp. 592-601.
Bright, Andrew. "Adaptive IIR Filters for Loudspeaker Parameter Tracking," 32nd Audio Engineering Society Conference, Sep. 21-23, 2007, pp. 1-8.
Klippel, Wolfgang. "Parameter Measurement of Passive Radiators," www.klippel.de, Application Note No. 57, Aug. 2013, pp. 1-16.

\* cited by examiner

SPEAKER EXCURSION PROTECTION

CROSS-REFERENCE TO RELATED APPLICATIONS

The present application claims priority to India Provisional Patent Application No. 201841046810, filed Dec. 11, 2018, entitled "Excursion Protection of Passive Radiator and Ported Speakers Using a Novel Feedback Algorithm," which is hereby incorporated herein by reference in its entirety.

BACKGROUND

To enhance bass response, some loudspeaker systems may include a passive radiator or a bass reflex port, in addition to a speaker. A passive radiator is similar to a speaker, but lacks a voice coil and magnet. In a passive radiator, the mass of the cone, the radiation inertia, and the stiffness of the suspension system form a resonant system which interacts with the speaker by coupling through the enclosed air of the speaker housing. A bass reflex port is an open tube that couples the interior of a speaker housing to air outside the speaker housing.

SUMMARY

Circuitry to protect a speaker system that includes a passive radiator or a bass reflex port from damage caused by excessive excursion is disclosed herein. In one example, an audio circuit includes a speaker housing, an amplifier, a voltage sensor, a current sensor and an excursion control circuit. The speaker housing includes a speaker, and a passive radiator or a bass reflex port. The amplifier is coupled to the speaker. The voltage sensor is coupled to the speaker. The current sensor is coupled to the speaker. The excursion control circuit is coupled to the amplifier, the voltage sensor, and the current sensor. The excursion control circuit includes back electro-magnetic force (EMF) measurement, a back-EMF model, and excursion protection. The back-EMF measurement is to measure back-EMF of the speaker based on voltage measurements received from the voltage sensor and current measurements received from the current sensor. The back-EMF model is updated based on measurements of the back-EMF and is converted to an excursion model. The excursion protection is to limit amplitude of audio signal provided to the amplifier based on the excursion model of the speaker and amplitude of an audio input signal.

In another example, an audio circuit includes an amplifier, a voltage sensor, a current sensor, and an excursion control circuit. The voltage sensor is coupled to an output of the amplifier. The current sensor is coupled to the output of the amplifier. The excursion control circuit is coupled to the amplifier, the voltage sensor, and the current sensor. The excursion control circuit includes back-EMF measurement, a back-EMF model, and excursion protection. The back-EMF measurement is to measure back electro-magnetic force of a speaker based on voltage measurements received from the voltage sensor and current measurements received from the current sensor. The back-EMF model is updated based on measurements of the back-EMF and is converted to an excursion model. The excursion protection is to limit amplitude of audio signal provided to the amplifier based on the excursion model of the speaker and amplitude of an audio input signal.

In a further example, an audio circuit includes an amplifier, a voltage sensor, a current sensor, and an excursion control circuit. The voltage sensor is coupled to an output of the amplifier. The current sensor is coupled to the output of the amplifier. The excursion control circuit includes a back-EMF measurement circuit, a second order back-EMF filter, a fourth order back-EMF filter, a port detection circuit, a back-EMF model to excursion model conversion circuit, and an excursion protection circuit. The back-EMF measurement circuit is coupled to an output of the voltage sensor and an output of the current sensor. The second order back-EMF filter is coupled to the back-EMF measurement circuit. The fourth order back-EMF filter is coupled to the second order back-EMF filter. The port detection circuit is coupled to the output of the voltage sensor, the output of the current sensor, and an input of the second order filter. The back-EMF model to excursion model conversion circuit is coupled to an output of the second order back-EMF filter and an output of the fourth order back-EMF filter. The excursion protection circuit coupled to an output of the back-EMF model to excursion model conversion circuit, an audio input, and an input of the amplifier.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

To improve bass response and sound pressure level, speaker systems that include passive radiators or bass reflex ports are sometime driven hard at low frequencies, which may damage the speaker. Various excursion protection techniques have been applied to reduce such damage. Automatic gain control (AGC) has been applied to limit the peak and root-mean-squared (RMS) power applied to the speaker. However, AGC based systems are overly conservative and significantly reduce the low frequency output by using high pass filters. High pass filters are used because a speaker's rated power is related to the thermal capacity of the speaker, so driving the speaker even at rated power at low frequencies will result in over excursion and speaker damage. Model based excursion control is also used to reduce speaker damage, and provides good bass and sound pressure level response at low frequencies. However, model based systems suffer from reliability issues. For example, model based systems cannot adapt to variations across speaker lot/temperature/aging, or changes due to opening or closing of the bass reflex port.

The excursion control circuits of the present disclosure include an excursion model that is updated based on real-time measurements of speaker current and voltage. Speaker excursion is estimated by filtering audio input using the adaptive excursion model. A limiter circuit compresses the audio signal if the estimated excursion exceeds a safety threshold. The limiting applies a look-ahead control technique to eliminate over excursion of the speaker. The excursion control circuits disclosed herein provide reliable excursion protection while enabling sound pressure levels and bass response that is substantially higher than other techniques.

Figure 1:
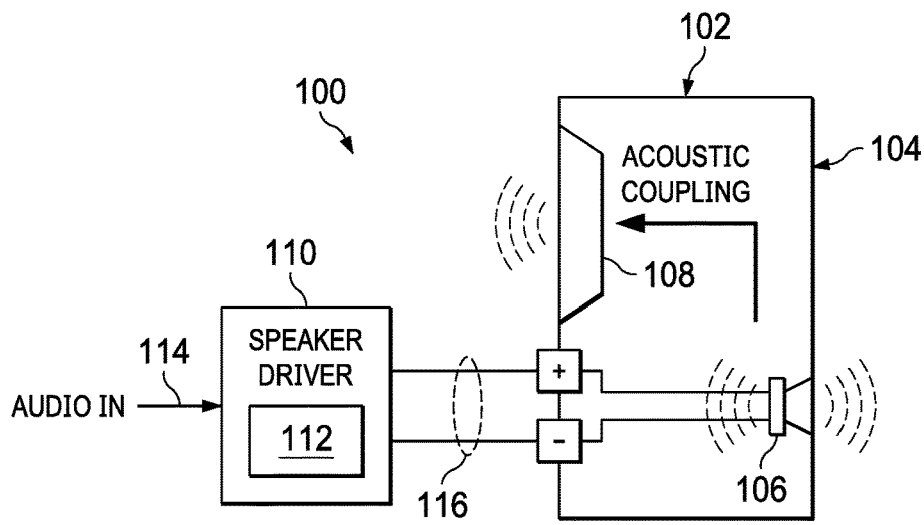
FIG. 1 shows a block diagram for an example audio circuit including a speaker system having a passive radiator.

FIG. 1 shows a block diagram for an example audio circuit 100 including a speaker system 102 having a passive radiator 108. The audio circuit 100 includes the speaker system 102 and a speaker driver circuit 110. The speaker system 102 includes a speaker 106 and the passive radiator 108. The speaker 106 includes a magnet and voice coil, while the passive radiator 108 lacks a magnet and voice coil. The speaker system 102 is coupled to the speaker driver circuit 110. The speaker driver circuit 110 receives an audio input signal 114 and generates an output signal 116 to actuate the speaker 106. The speaker driver circuit 110 includes an excursion control circuit 112 as disclosed herein to limit excursion of the speaker 106 and prevent damage thereto.

Figure 2:
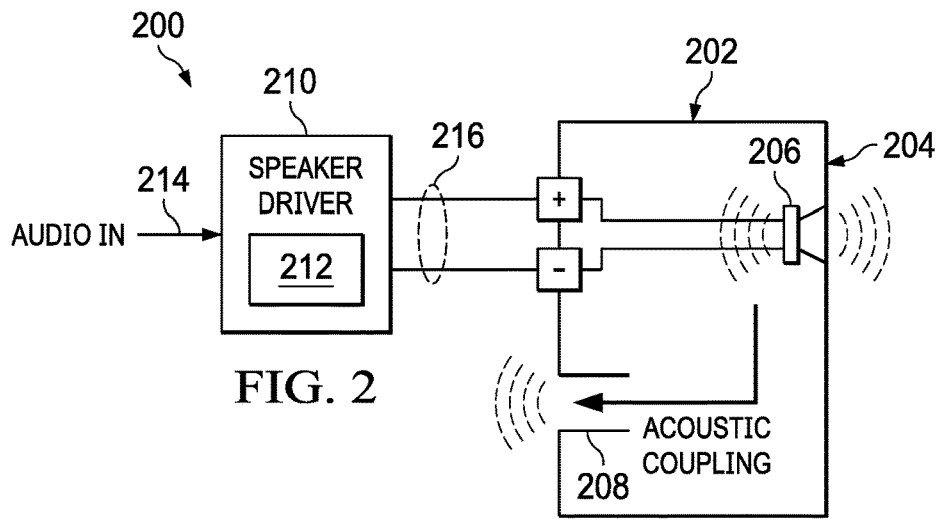
FIG. 2 show a block diagram for an example audio circuit including a speaker system having a bass reflex port.

FIG. 2 show a block diagram for an example audio circuit 200 including a speaker system 202 having a bass reflex port 208. The audio circuit 200 includes the speaker system 202 and a speaker driver circuit 210. The speaker system 202 includes a speaker 206 and the bass reflex port 208. The speaker system 202 is coupled to the speaker driver circuit 210. The speaker driver circuit 210 receives an audio input signal 214 and generates an output signal 216 to actuate the speaker 206. The speaker driver circuit 210 includes an excursion control circuit 212 as disclosed herein to limit excursion of the speaker 206 and prevent damage thereto.

Figure 3:
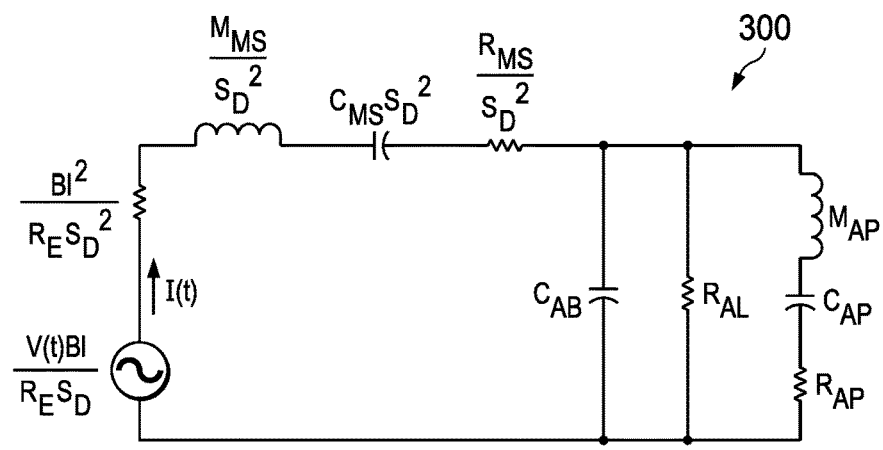
FIG. 3 shows an electrical equivalent circuit for a speaker system that includes a passive radiator or a bass reflex port.

FIG. 3 shows an electrical equivalent circuit 300 for a speaker system that includes a passive radiator or a bass reflex port (e.g., the speaker system 102 or the speaker system 202). In the electrical equivalent circuit 300:
V(t) is input voltage;
I(t) is loop current;
X(t) is excursion;
Bl is force factor;
$R_E$ is DC resistance of the voice coil;
$R_{MS}$ is mechanical dampening of the speaker;
$C_{MS}$ is mechanical compliance of the speaker;
$M_{MS}$ is mechanical mass of the speaker;
$S_D$ is radiating area of the speaker;
$C_{AB}$ is housing compliance;
$R_{AP}$ is mechanical dampening of the passive radiator;
$C_{AP}$ is mechanical compliance of the passive radiator;

$M_{AP}$ is mechanical mass of the passive radiator or the bass reflex port;
$R_{AL}$ is the mechanical loss of the port.

For a speaker system that includes a passive radiator, $R_{AL} \to \infty$. For a speaker system that includes a bass reflex port, $R_{AP} \to 0$ and $C_{AP} \to \infty$. The parameters of a speaker vary across lots, with temperature, and with age, while the passive radiator and bass reflex ports parameters do not change.

The back electro-motive force (EMF) transfer function for a speaker is a fourth order system that is expressed as:

$$BEMF(t) = V(t) - I(t)R_E \quad (1)$$

$$\frac{BEMF(s)}{I(s)} = H(s) = \frac{B_3 s^3 + B_2 s^2 + B_1 s}{s^4 + A_3 s^3 + A_2 s^2 + A_1 s + A_0}$$

For a speaker system that includes a passive radiator:

$$B_3 = \frac{Bl^2}{M_{MS}}, \; B_2 = \frac{Bl^2 R_{AP}}{M_{MS} M_{AP}}, \; B_1 = \frac{Bl^2 (C_{AP} + C_{AB})}{M_{MS} C_{AP} C_{AB}}$$

$$A_3 = \frac{R_{AP}}{M_{AP}} + \frac{R_{MS}}{M_{MS}},$$

$$A_2 = \frac{C_{AP} + C_{AB}}{M_{AP} C_{AP} C_{AB}} + \frac{R_{AP} R_{MS}}{M_{AP} M_{MS}} + \frac{1}{M_{MS}} \left( \frac{1}{C_{MS}} + \frac{s_d^2}{C_{AB}} \right)$$

$$A_1 = \frac{C_{AP} + C_{AB}}{M_{AP} C_{AP} C_{AB}} \times \frac{R_{MS}}{M_{MS}} + \frac{R_{AP}}{M_{AP}} \times \frac{1}{M_{MS}} \left( \frac{1}{C_{MS}} + \frac{s_d^2}{C_{AB}} \right),$$

$$A_0 = \frac{C_{AP} + C_{AB} + s_d^2 C_{MS}}{M_{MS} C_{MS} M_{AP} C_{AP} C_{AB}}$$

For a speaker system that includes a bass reflex port:

$$B_3 = \frac{Bl^2}{M_{MS}}, \; B_2 = \frac{Bl^2}{M_{MS} C_{AB} R_{AL}}, \; B_1 = \frac{Bl^2}{M_{MS} M_{AP} C_{AB}}$$

$$A_3 = \frac{1}{C_{AB} R_{AL}} + \frac{R_{MS}}{M_{MS}},$$

$$A_2 = \frac{1}{M_{AP} C_{AB}} + \frac{1}{C_{AB} R_{AL}} \times \frac{R_{MS}}{M_{MS}} + \frac{1}{M_{MS}} \left( \frac{1}{C_{MS}} + \frac{s_d^2}{C_{AB}} \right)$$

$$A_1 = \frac{R_{MS}}{M_{AP} C_{AB} M_{MS}} + \frac{1}{C_{AB} R_{AL}} \times \frac{1}{M_{MS} C_{MS}},$$

$$A_0 = \frac{1}{M_{MS} C_{MS} M_{AP} C_{AB}}$$

The speaker excursion transfer function is a fourth order system that is expressed as:

$$\frac{X(s)}{V(s)} = \overline{H}(s) = \frac{\overline{B_2} s^2 + \overline{B_1} s + \overline{B_0}}{s^4 + \overline{A_3} s^3 + \overline{A_2} s^2 + \overline{A_1} s^1 + \overline{A_0}}$$

For a speaker system that includes a passive radiator:

$$\overline{B_2} = \frac{Bl}{M_{MS} R_E}, \; \overline{B_1} = \frac{Bl R_{AP}}{M_{MS} R_E M_{AP}}, \; \overline{B_0} = \frac{Bl(C_{AP} + C_{AB})}{M_{MS} R_E M_{AP} C_{AP} C_{AB}}$$

$$\overline{A_3} = \frac{R_{AP}}{M_{AP}} + \frac{R_{MS} + \frac{Bl^2}{R_E}}{M_{MS}},$$

-continued $$\overline{A_2} = \frac{C_{AP} + C_{AB}}{M_{AP}C_{AP}C_{AB}} + \frac{R_{AP}}{M_{AP}} \times \frac{R_{MS} + \frac{Bl^2}{R_E}}{M_{MS}} + \frac{1}{M_{MS}}\left(\frac{1}{C_{MS}} + \frac{s_d^2}{C_{AB}}\right)$$

$$\overline{A_1} = \frac{C_{AP} + C_{AB}}{M_{AP}C_{AP}C_{AB}} \times \frac{R_{MS} + \frac{Bl^2}{R_E}}{M_{MS}} + \frac{R_{AP}}{M_{AP}} \times \frac{1}{M_{MS}}\left(\frac{1}{C_{MS}} + \frac{s_d^2}{C_{AB}}\right),$$

$$\overline{A_0} = \frac{C_{AP} + C_{AB} + s_d^2 C_{MS}}{M_{MS}C_{MS}M_{AP}C_{AP}C_{AB}}$$

For a speaker system that includes a bass reflex port:

$$\overline{B_2} = \frac{Bl}{M_{MS}R_E}, \overline{B_1} = \frac{Bl}{M_{MS}R_E C_{AB}R_{AL}}, \overline{B_0} = \frac{Bl}{M_{MS}R_E M_{AP}C_{AB}}$$

$$\overline{A_3} = \frac{1}{C_{AB}R_{AL}} + \frac{R_{MS} + \frac{Bl^2}{R_E}}{M_{MS}},$$

$$\overline{A_2} = \frac{1}{M_{AP}C_{AB}} + \frac{1}{C_{AB}R_{AL}} \times \frac{R_{MS} + \frac{Bl^2}{R_E}}{M_{MS}} + \frac{1}{M_{MS}}\left(\frac{1}{C_{MS}} + \frac{s_d^2}{C_{AB}}\right)$$

$$\overline{A_1} = \frac{1}{M_{AP}C_{AB}} \times \frac{R_{MS} + \frac{Bl^2}{R_E}}{M_{MS}} + \frac{1}{C_{AB}R_{AL}} \times \frac{1}{M_{MS}C_{MS}},$$

$$\overline{A_0} = \frac{1}{M_{MS}C_{MS}M_{AP}C_{AB}}$$

Figure 4:
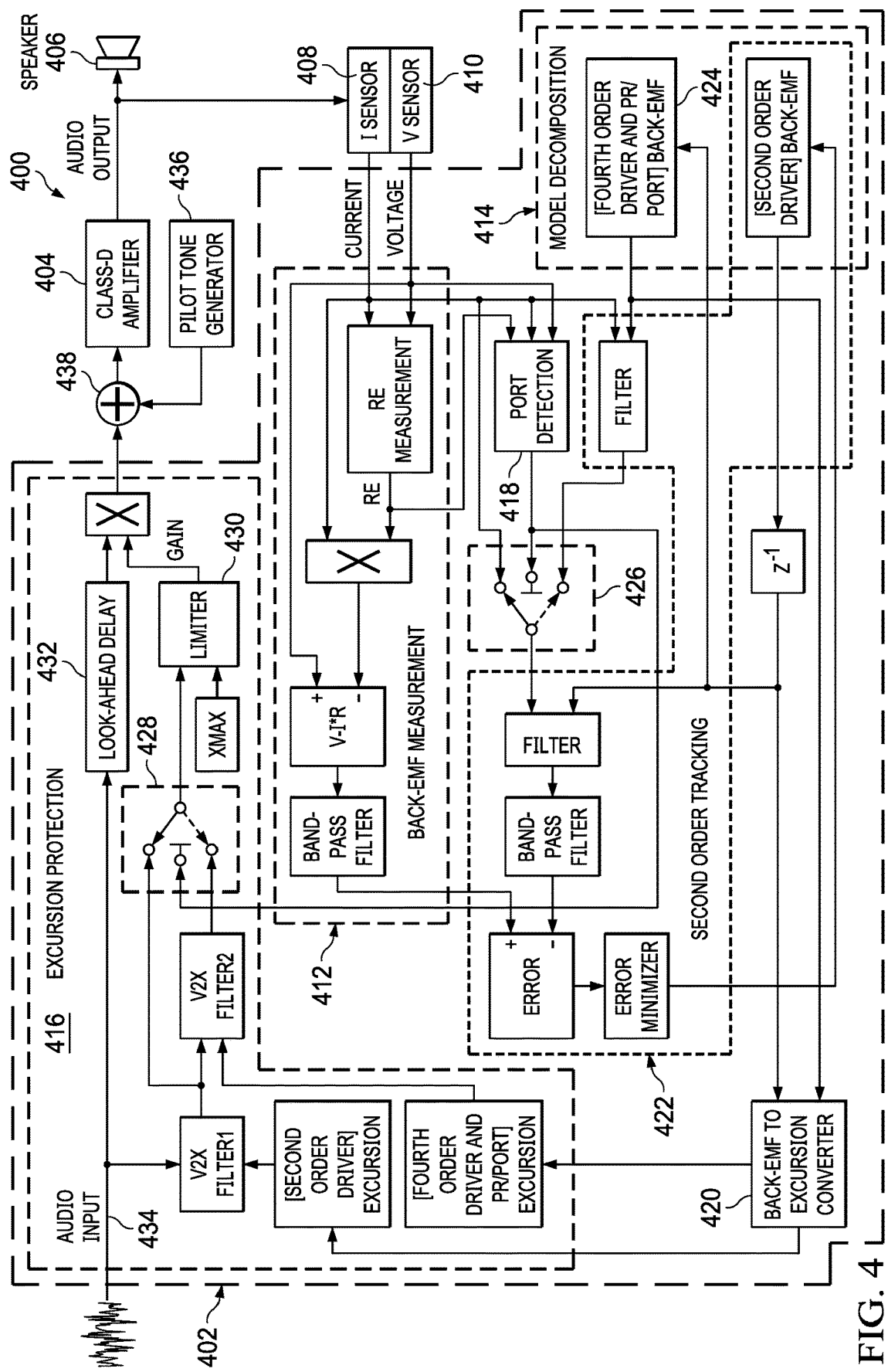
FIG. 4 shows an example block diagram for an audio circuit that includes an excursion control circuit in accordance with the present disclosure.

FIG. 4 shows an example block diagram for an audio circuit 400 that includes an excursion control circuit 402 in accordance with the present disclosure. The excursion control circuit 402 is an implementation of the excursion control circuit 112 or the excursion control circuit 212. The audio circuit 400 includes an amplifier 404 coupled to the excursion control circuit 402, a speaker system 406 that is coupled to the amplifier 404, a current sensor 408, and a voltage sensor 410. The amplifier 404 is a class-D amplifier in some implementations of the audio circuit 400. The speaker system 406 is an implementation of the speaker system 102 or the speaker system 202, and includes a passive radiator or a bass reflex port. The current sensor 408 and the voltage sensor 410 are coupled to the amplifier 404, the speaker system 406 and the excursion control circuit 402. The current sensor 408 and the voltage sensor 410 respectively measure current and voltage in the speaker system 406. The excursion control circuit 402 applies the current and voltage measurements to update tracking of a back-EMF filter used to estimate excursion of a speaker in the speaker system 406.

The excursion control circuit 402 includes back-EMF measurement 412, a back-EMF model 414, excursion protection 416, port detection 418, and back-EMF model to excursion model conversion 420. The back-EMF measurement 412 is coupled to the current sensor 408 and the voltage sensor 410, and determines values of Back-EMF of the speaker system 406 per equation (1). The DC resistance $R_E$ can be temperature dependent, and can vary over time in some examples of the speaker system 406. In some implementations of the audio circuit 400, a pilot tone generator 436 injects a very low frequency signal into the amplifier 404 via the summation circuit 438 so that $R_E$ can be estimated. By measuring the low-frequency component of V(t) and I(t) denoted respectively as $V_{lf}(t)$ and $I_{lf}(t)$ the DC resistance $R_E$ can be estimated by $$R_E = \frac{V_{lf}(t)}{I_{lf}(t)}.$$

Since the pilot tone is at very low frequency (close to DC), the measurement of $R_E$ is very accurate and very close to the DC resistance value. The measured back-EMF values are filtered around a resonant frequency of the speaker in some implementations.

In the back-EMF model 414, the fourth order back-EMF filter H(s) is split into a second order filter ($H_1$(s)) 422 and a fourth order filter ($H_2$(s)) 424.

$$\frac{BEMF(s)}{I(s)} = H(s) = H_1(s) \times H_2(s)$$

The second order filter 422 includes only driver elements (i.e., speaker elements), which are variable.

$$H_1(s) = \frac{B_1' s}{s^2 + A_1' s + A_0'}, B_1' = \frac{Bl^2}{M_{MS}},$$

$$A_1' = \frac{R_{MS}}{M_{MS}}, A_0' = \frac{1}{M_{MS}}\left(\frac{1}{C_{MS}} + \frac{s_d^2}{C_{AB}}\right)$$

The fourth order filter 424 includes both the driver elements and the passive radiator or bass reflex port elements, which are fixed. The second order filter 422 is coupled to the back-EMF measurement 412, and is continuously adapted to track measured speaker back-EMF provided by the back-EMF measurement 412 by minimizing the error between the estimated back-EMF generated by the second order filter 422 and the measured speaker back-EMF provided by the back-EMF measurement 412. Some implementations of the second order filter 422 employ least-squares minimization. The fourth order filter 424 is coupled to the second order filter 422, and updated based on output of the second order filter 422. $H_2$(s) has a weak effect on H(s) near resonance of the speaker, and filtering of the measured back-EMF about speaker resonance in the back-EMF measurement 412 makes error minimization based on $H_1$(s) effective and accurate.

Back-EMF error minimization in the second order filter 422 is expressed as:

BEMF(s)=$H_1$(s)$H_2$(s)I(s)

BEMF$_{est}$(t)=$H_1$(t)⊕$H_2$(t)⊕I(t)

BEMF$_{act}$(t)=V(t)−I(t)$R_E$

Err(t)=BEMF$_{act}$(t)−BEMF$_{est}$(t)

For a speaker system 406 that includes a passive radiator, the fourth order filter 424 is described as:

$$H_2(s) = \frac{s^4 + B_3'' s^3 + B_2'' s^2 + B_1'' s + B_0''}{s^4 + B_3'' s^3 + B_2'' s^2 + B_1'' s + A_0''}$$

$$B_3'' = \frac{R_{AP}}{M_{AP}} + \frac{R_{MS}}{M_{MS}},$$

$$B_2'' = \frac{C_{AP} + C_{AB}}{M_{AP}C_{AP}C_{AB}} + \frac{R_{AP}}{M_{AP}} \times \frac{R_{MS}}{M_{MS}} + \frac{1}{M_{MS}}\left(\frac{1}{C_{MS}} + \frac{s_d^2}{C_{AB}}\right)$$

-continued $$B_1'' = \frac{C_{AP} + C_{AB}}{M_{AP}C_{AP}C_{AB}} \times \frac{R_{MS}}{M_{MS}} + \frac{R_{AP}}{M_{AP}} \times \frac{1}{M_{MS}}\left(\frac{1}{C_{MS}} + \frac{s_d^2}{C_{AB}}\right)$$

$$B_0'' = \frac{C_{AP} + C_{AB}}{M_{AP}C_{AP}C_{AB}} \times \frac{1}{M_{MS}}\left(\frac{1}{C_{MS}} + \frac{s_d^2}{C_{AB}}\right)$$

$$A_0'' = \frac{C_{AP} + C_{AB} + s_d^2 C_{MS}}{M_{MS}C_{MS}M_{AP}C_{AP}C_{AB}}$$

For a speaker system 406 that includes a bass reflex port, the fourth order filter 424 is described as:

$$H_2(s) = \frac{s^4 + B_3''s^3 + B_2''s^2 + B_1''s + B_0''}{s^4 + B_3''s^3 + B_2''s^2 + A_1''s + A_0''}$$

$$B_3'' = \frac{1}{C_{AB}R_{AL}} + \frac{R_{MS}}{M_{MS}},$$

$$B_2'' = \frac{1}{M_{AP}C_{AP}} + \frac{1}{R_{AL}C_{AB}} \times \frac{R_{MS}}{M_{MS}} + \frac{1}{M_{MS}}\left(\frac{1}{C_{MS}} + \frac{s_d^2}{C_{AB}}\right)$$

$$B_1'' = \frac{1}{M_{AP}C_{AB}} \times \frac{R_{MS}}{M_{MS}} + \frac{1}{R_{AL}C_{AB}} \times \frac{1}{M_{MS}}\left(\frac{1}{C_{MS}} + \frac{s_d^2}{C_{AB}}\right)$$

$$B_0'' = \frac{1}{M_{AP}C_{AB}} \times \frac{1}{M_{MS}}\left(\frac{1}{C_{MS}} + \frac{s_d^2}{C_{AB}}\right)$$

$$A_1'' = \frac{1}{M_{AP}C_{AB}} \times \frac{R_{MS}}{M_{MS}} + \frac{1}{R_{AL}C_{AB}} \times \frac{1}{M_{MS}C_{MS}}$$

$$A_0'' = \frac{1}{M_{MS}C_{MS}M_{AP}C_{AB}}$$

The excursion protection 416 is coupled to the back-EMF model to excursion model conversion 420, an audio input 434, and the amplifier 404. The excursion model generated by the back-EMF model to excursion model conversion 420 is provided to the excursion protection 416. The speaker excursion model is also decomposed in second order and fourth order filters.

$$\frac{X(s)}{V(s)} = \overline{H}(s) = \overline{H_1}(s) \times \overline{H_2}(s)$$

$$\overline{H_1}(s) = \frac{\overline{B_0}'}{s^2 + \overline{A_1}'s + \overline{A_0}'}, \overline{B_0}' = \frac{Bl}{M_{MS}R_E},$$

$$\overline{A_1}' = \frac{R_{MS} + \frac{Bl^2}{R_E}}{M_{MS}}, \overline{A_0}' = \frac{1}{M_{MS}}\left(\frac{1}{C_{MS}} + \frac{s_d^2}{C_{AB}}\right)$$

The fourth order excursion filter for a speaker with a passive radiator is expressed as:

$$\overline{H_2}(s) = \frac{s^4 + \overline{B_3}''s^3 + \overline{B_2}''s^2 + \overline{B_1}''s + \overline{B_0}''}{s^4 + \overline{B_3}''s^3 + \overline{B_2}''s^2 + \overline{B_1}''s + \overline{A_0}''}$$

$$\overline{B_3}'' = \frac{R_{AP}}{M_{AP}} + \frac{R_{MS} + \frac{Bl^2}{R_E}}{M_{MS}},$$

$$\overline{B_2}'' = \frac{C_{AP} + C_{AB}}{M_{AP}C_{AP}C_{AB}} + \frac{R_{AP}}{M_{AP}} \times \frac{R_{MS} + \frac{Bl^2}{R_E}}{M_{MS}} + \frac{1}{M_{MS}}\left(\frac{1}{C_{MS}} + \frac{s_d^2}{C_{AB}}\right)$$

$$\overline{B_1}'' = \frac{C_{AP} + C_{AB}}{M_{AP}C_{AP}C_{AB}} \times \frac{R_{MS} + \frac{Bl^2}{R_E}}{M_{MS}} + \frac{R_{AP}}{M_{AP}} \times \frac{1}{M_{MS}}\left(\frac{1}{C_{MS}} + \frac{s_d^2}{C_{AB}}\right)$$

$$\overline{B_0}'' = \frac{C_{AP} + C_{AB}}{M_{AP}C_{AP}C_{AB}} \times \frac{1}{M_{MS}}\left(\frac{1}{C_{MS}} + \frac{s_d^2}{C_{AB}}\right)$$

$$\overline{A_0}'' = \frac{C_{AP} + C_{AB} + s_d^2 C_{MS}}{M_{MS}C_{MS}M_{AP}C_{AP}C_{AB}}$$

The fourth order excursion filter for a speaker and bass reflex port is expressed as:

$$\overline{H_2}(s) = \frac{s^4 + \overline{B_3}''s^3 + \overline{B_2}''s^2 + \overline{B_1}''s + \overline{B_0}''}{s^4 + \overline{B_3}''s^3 + \overline{B_2}''s^2 + \overline{A_1}''s + \overline{A_0}''}$$

$$\overline{B_3}'' = \frac{1}{C_{AB}R_{AL}} + \frac{R_{MS} + \frac{Bl^2}{R_E}}{M_{MS}},$$

$$\overline{B_2}'' = \frac{1}{M_{AP}C_{AB}} + \frac{1}{R_{AL}C_{AB}} \times \frac{R_{MS} + \frac{Bl^2}{R_E}}{M_{MS}} + \frac{1}{M_{MS}}\left(\frac{1}{C_{MS}} + \frac{s_d^2}{C_{AB}}\right)$$

$$\overline{B_1}'' = \frac{1}{M_{AP}C_{AB}} \times \frac{R_{MS}\frac{Bl^2}{R_E}}{M_{MS}} + \frac{1}{R_{AL}C_{AB}} \times \frac{1}{M_{MS}}\left(\frac{1}{C_{MS}} + \frac{s_d^2}{C_{AB}}\right)$$

$$\overline{B_0}'' = \frac{1}{M_{AP}C_{AB}} \times \frac{1}{M_{MS}}\left(\frac{1}{C_{MS}} + \frac{s_d^2}{C_{AB}}\right)$$

$$\overline{A_1}'' = \frac{1}{M_{AP}C_{AB}} \times \frac{R_{MS} + \frac{Bl^2}{R_E}}{M_{MS}} + \frac{1}{R_{AL}C_{AB}} \times \frac{1}{M_{MS}C_{MS}}$$

$$\overline{A_0}'' = \frac{1}{M_{MS}C_{MS}M_{AP}C_{AB}}$$

In the speaker system 406, $H_1(s)$ and $H_2(s)$ are in the back-EMF domain $$\left(\frac{BEMF(s)}{I(s)}\right),$$

and $\overline{H_1}(s)$ and $\overline{H_2}(s)$ are in the excursion domain $$\left(\frac{X(s)}{V(s)}\right).$$

The back-EMF model 414 (including $2^{nd}$ order filter $H_1(s)$ and $4^{th}$ order filter $H_2(s)$) is converted to excursion model (including $2^{nd}$ order filter $\overline{H_1}(s)$ and $4^{th}$ order filter $\overline{H_2}(s)$) by the back-EMF model to excursion model conversion 420. Although these equations are represented by the continuous time variable "s", the actual implementation uses the discrete time variable "z". The back-EMF model to excursion model conversion 420 is coupled to the second order filter 422 and the fourth order filter 424. Conversion from back-EMF domain to excursion domain includes sample rate conversion where $H_1(s)$ and $\overline{H_2}(s)$ are computed at a lower sample rate $\left(e.g., \frac{f_s}{N}\right)$, and $\overline{H_1}(s)$ and $\overline{H_2}(s)$ are applied at the audio sampling rate $f_s$ such as for example 48 KHz. The estimation of back-EMF parameters $H_1(s)$ and $H_2(s)$ at a lower sampling rate significantly reduces the processing load of the illustrative system 400. In some implementations, N=8 and the lower sampling rate equals 6 KHz. The back-EMF to excursion mapping is expressed as: In the Back-EMF domain:

$$\frac{BEMF(z)}{I(z)} = H(z) = H_1(z)H_2(z) = H_1(s)\Big|_{s=2f_s\frac{1-z^{-1}}{1+z^{-1}}} \times H_2(s)\Big|_{s=2f_s\frac{1-z^{-1}}{1+z^{-1}}}$$

$$H_1(z) = \frac{b_0'(1-z^{-2})}{1+a_1'z^{-1}+a_2'z^{-2}}$$

For a speaker and passive radiator:

$$H_2(z) = \frac{(1+a_1'z^{-1}+a_2'z^{-2})(1+s_1z^{-1}+s_2z^{-2})}{(1+a_1'z^{-1}+a_2'z^{-2})(1+s_1z^{-1}+s_2z^{-2})-}$$
$$b_0' \times \frac{S_d^2}{2f_sBl^2M_{ap}C_{ab}^2K_S}(1+z^{-1})^4$$

For a speaker and bass reflex port:

$$H_2(z) = \frac{(1+a_1'z^{-1}+a_2'z^{-2})(1+s_1z^{-1}+s_2z^{-2})}{(1+a_1'z^{-1}+a_2'z^{-2})(1+s_1z^{-1}+s_2z^{-2})-}$$
$$b_0' \times \frac{S_d^2}{Bl^2R_{al}C_{ab}^2K_S}(1-z^{-1})(1+z^{-1})^3 -$$
$$b_0' \times \frac{S_d^2}{2f_sBl^2M_{ap}C_{ab}^2K_S}(1+z^{-1})^4$$

In the excursion domain:

$$\frac{X(z)}{V(z)} = \overline{H}(z) = \overline{H_1}(z)\overline{H_2}(z) = \overline{H_1}(s)\Big|_{s=2f_s\frac{1-z^{-1}}{1+z^{-1}}} \times \overline{H_2}(s)\Big|_{s=2f_s\frac{1-z^{-1}}{1+z^{-1}}}$$

$$\overline{H_1}(z) = \frac{1}{2f_sBlR_E} \times \frac{\overline{b_0}'(1+z^{-1})^2}{1+\overline{a_1}'z^{-1}+\overline{a_2}'z^{-2}}$$

where "s" is the continuous time variable and "z" is the discrete time variable.

The $\{b_0', a_1', a_2'\}$ parameters are continuously adapted by minimizing the error between the estimated back-EMF generated by the second order filter 422 and the measured speaker back-EMF provided by the back-EMF measurement 412 (as described herein).

For a speaker and passive radiator:

$$\overline{H_2}(z) = \frac{(1+\overline{a_1}'z^{-1}+\overline{a_2}'z^{-2})(1+s_1z^{-1}+s_2z^{-2})}{(1+\overline{a_1}'z^{-1}+\overline{a_2}'z^{-2})(1+s_1z^{-1}+s_2z^{-2})-}$$
$$\overline{b_0}' \frac{S_d^2}{2f_sBl^2M_{ap}C_{ab}^2K_S}(1+z^{-1})^4$$

$$K_s = 4f_s^2 + 2f_s\frac{R_{ap}}{M_{ap}} + \frac{C_{ap}+C_{ab}}{M_{ap}C_{ap}C_{ab}}$$

$$s_1 = \frac{-8f_s^2 + 2\frac{C_{ap}+C_{ab}}{M_{ap}C_{ap}C_{ab}}}{4f_s^2 + 2f_s\frac{R_{ap}}{M_{ap}} + \frac{C_{ap}+C_{ab}}{M_{ap}C_{ap}C_{ab}}}$$

$$s_2 = \frac{4f_s^2 - 2f_s\frac{R_{ap}}{M_{ap}} + \frac{C_{ap}+C_{ab}}{M_{ap}C_{ap}C_{ab}}}{4f_s^2 + 2f_s\frac{R_{ap}}{M_{ap}} + \frac{C_{ap}+C_{ab}}{M_{ap}C_{ap}C_{ab}}}$$

For a speaker and bass reflex port:

$$\overline{H_2}(z) = \frac{(1+\overline{a_1}'z^{-1}+\overline{a_2}'z^{-2})(1+s_1z^{-1}+s_2z^{-2})}{(1+\overline{a_1}'z^{-1}+\overline{a_2}'z^{-2})(1+s_1z^{-1}+s_2z^{-2})-}$$
$$\overline{b_0}' \frac{S_d^2}{Bl^2R_{al}C_{ab}^2K_S}(1-z^{-1})(1+z^{-1})^3 -$$
$$\overline{b_0}' \frac{S_d^2}{2f_sBl^2M_{ap}C_{ab}^2K_S}(1+z^{-1})^4$$

$$K_s = 4f_s^2 + 2f_s\frac{1}{C_{ab}R_{al}} + \frac{1}{M_{ap}C_{ab}}$$

$$s_1 = \frac{-8f_s^2 + 2\frac{2}{M_{ap}C_{ab}}}{4f_s^2 + 2f_s\frac{1}{C_{ab}R_{al}} + \frac{1}{M_{ap}C_{ab}}}$$

$$s_2 = \frac{4f_s^2 - 2f_s\frac{1}{C_{ab}R_{al}} + \frac{1}{M_{ap}C_{ab}}}{4f_s^2 + 2f_s\frac{1}{C_{ab}R_{al}} + \frac{1}{M_{ap}C_{ab}}}$$

In the back-EMF to excursion mapping, the parameters $\{\overline{b_0}', \overline{a_1}', \overline{a_2}'\}$ of $\overline{H_1}(z)$ and $\overline{H_2}(z)$ are derived from the parameters $\{b_0', a_1', a_2'\}$ of $H_1(z)$ and $H_2(z)$.

$$\overline{b_0}' = \frac{4b_1'KK'}{(K+K')^2+(K^2-K'^2)a_1'+(K-K')^2a_2'+(1-a_1'+a_2')\gamma K'}$$

$$\overline{a_1}' = \frac{2((K^2-K'^2)+(K^2+K'^2)a_1'+(K^2-K'^2)a_2')}{(K+K')^2+(K^2-K'^2)a_1'+(K-K')^2a_2'+(1-a_1'+a_2')\gamma K'}$$

$$\overline{a_2}' = \frac{(K-K')^2+(K^2-K'^2)a_1'+(K-K')^2a_2'-(1-a_1'+a_2')\gamma K'}{(K+K')^2+(K^2-K'^2)a_1'+(K-K')^2a_2'+(1-a_1'+a_2')\gamma K'}$$

$$K = \frac{2f_s}{N}, K' = 2f_s, \gamma = \frac{Bl^2}{M_{MS}R_E}$$

In these equations it is assumed that $H_1(z)$ and $H_2(z)$ are computed at lower sampling rate $$\frac{f_s}{N}$$

but the technique is equally applicable for implementations where $H_1(z)$, $H_2(z)$ and $\overline{H_1}(z)$, $\overline{H_2}(z)$ are computed at the same audio sampling rate $f_s$, i.e., N=1.

The excursion protection 416 applies the excursion model received from the back-EMF model to excursion model conversion 420 in conjunction with an audio input signal to estimate speaker excursion resulting from the audio input signal. The estimated speaker excursion is expressed as:

$$Xest(t) = \overline{H_1}(t) \oplus \overline{H_2}(t) \oplus \text{In}(t)$$

where In(t) is the audio input signal.

If $X_{est}(t)$ exceeds a predetermined excursion limit (Xmax), then the excursion protection 416 limits the output signal amplitude as $$\text{Out}(t) = \text{In}(t) \times \frac{X_{max}}{X_{est}(t)}.$$

If $X_{est}(t)$ does not exceed the predetermined excursion limit, the output signal is equal to the input signal (Out(t)=In(t)). The excursion protection 416 includes a delay buffer 432 coupled to the audio input 434 and the amplifier 404. The delay buffer 432 delays the audio input signal to allow a determination of excursion based on the audio input signal and attenuation of the audio signal before the audio signal is provided to the amplifier 404. The delay buffer 432 provides 3-10 milliseconds of delay in some implementations of the excursion control circuit 402.

A speaker system 406 with a bass reflex port is a fourth order system $$\frac{BEMF(s)}{I(s)} = H_1(s)H_2(s).$$

However, if the port is closed (e.g., blocked by an object external to the speaker system 406), then the system becomes second order $$\frac{BEMF(s)}{I(s)} = H_1(s).$$

To accommodate variable port state, the excursion control circuit 402 includes the port detection 418. The port detection 418 detects whether the port is open or closed. The port detection 418 is coupled to the voltage sensor 410, the current sensor 408, and the second order filter 422.

Figure 5:
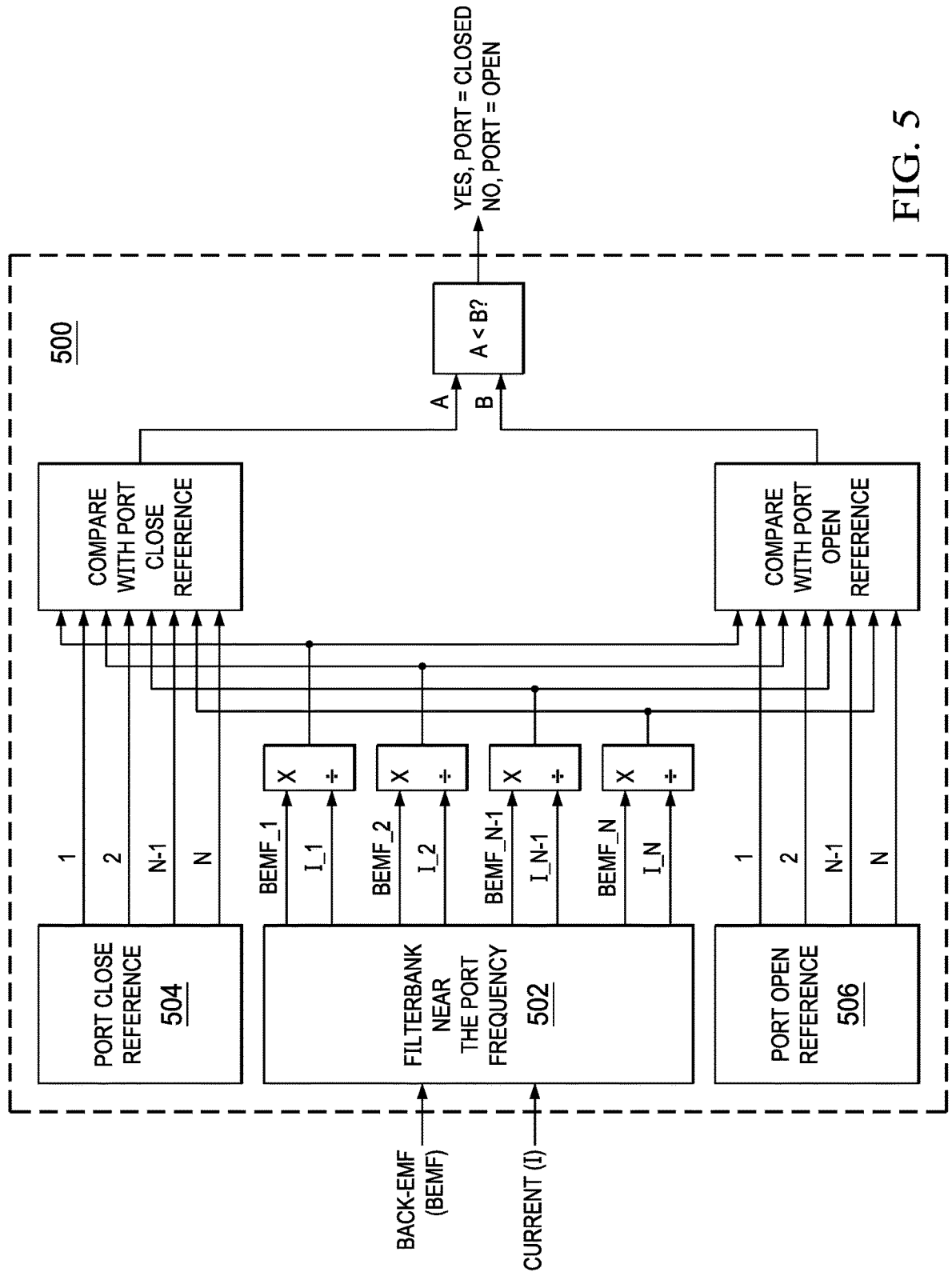
FIG. 5 shows an example block diagram for a port detection circuit in accordance with the present disclosure.

FIG. 5 shows an example block diagram for a port detection circuit 500 in accordance with the present disclosure. The port detection circuit 500 is an implementation of the port detection 418. In the port detection circuit 500, BEMF(s) and I(s) are passed through an N-band filter bank 502 near the port frequency, and the magnitude of $$\frac{BEMF(s)}{I(s)}$$

is computed in each band. For each band, the computed magnitude of $$\frac{BEMF(s)}{I(s)}$$

is compared to a port closed reference 504 and a port open reference 506. The comparisons produce a port open metric and a port closed metric.

$$PortOpenMetric = \sum_{i=1}^{N} \left\| \left| \frac{BEMF(s)}{I(s)} \right|_i - \left| \frac{BEMF(s)}{I(s)} \right|_{PortOpen} \right\|^2$$

$$PortClosedMetric = \sum_{i=1}^{N} \left\| \left| \frac{BEMF(s)}{I(s)} \right|_i - \left| \frac{BEMF(s)}{I(s)} \right|_{PortClosed} \right\|^2$$

The port detection circuit 500 deems the port open if the PortClosedMetric exceeds the PortOpenMetric, and closed if the PortOpenMetric exceeds the PortClosedMetric.

The excursion control circuit 402 applies output of the port detection 418 to select second order or fourth order operation. The excursion control circuit 402 includes a switch 426 that is controlled by output of the port detection 418. The switch 426 is coupled to the current sensor 408, the fourth order filter 424, the port detection 418, and the second order filter 422. If the port is closed, the switch 426 routes current measurements from the current sensor 408 to the second order filter 422. If the port is open, the switch 426 routes the filtered output obtained by passing the current measurements from the current sensor 408 through the fourth order filter 424 to the second order filter 422.

Similarly, the excursion protection 416 includes a switch 428 that is controlled by the port detection 418. The switch 428 is coupled to the port detection 418, the back-EMF model to excursion model conversion 420, and the audio input 434. If the port is open, the switch 428 routes excursion estimates based on applying fourth order excursion model and second order excursion model to the audio input signal to the limiter 430 for use in determining whether the excursion exceeds the predetermined maximum. If the port is closed, the switch 428 routes excursion estimates based on applying only second order excursion model to the audio input signal to the limiter 430 for use in determining whether the excursion exceeds the predetermined maximum. The limiter 430 controls the gain applied to audio signal received from the delay buffer 432. The limiter 430 is coupled to the switch 428, the delay buffer 432, and the amplifier 404.

Figure 6:
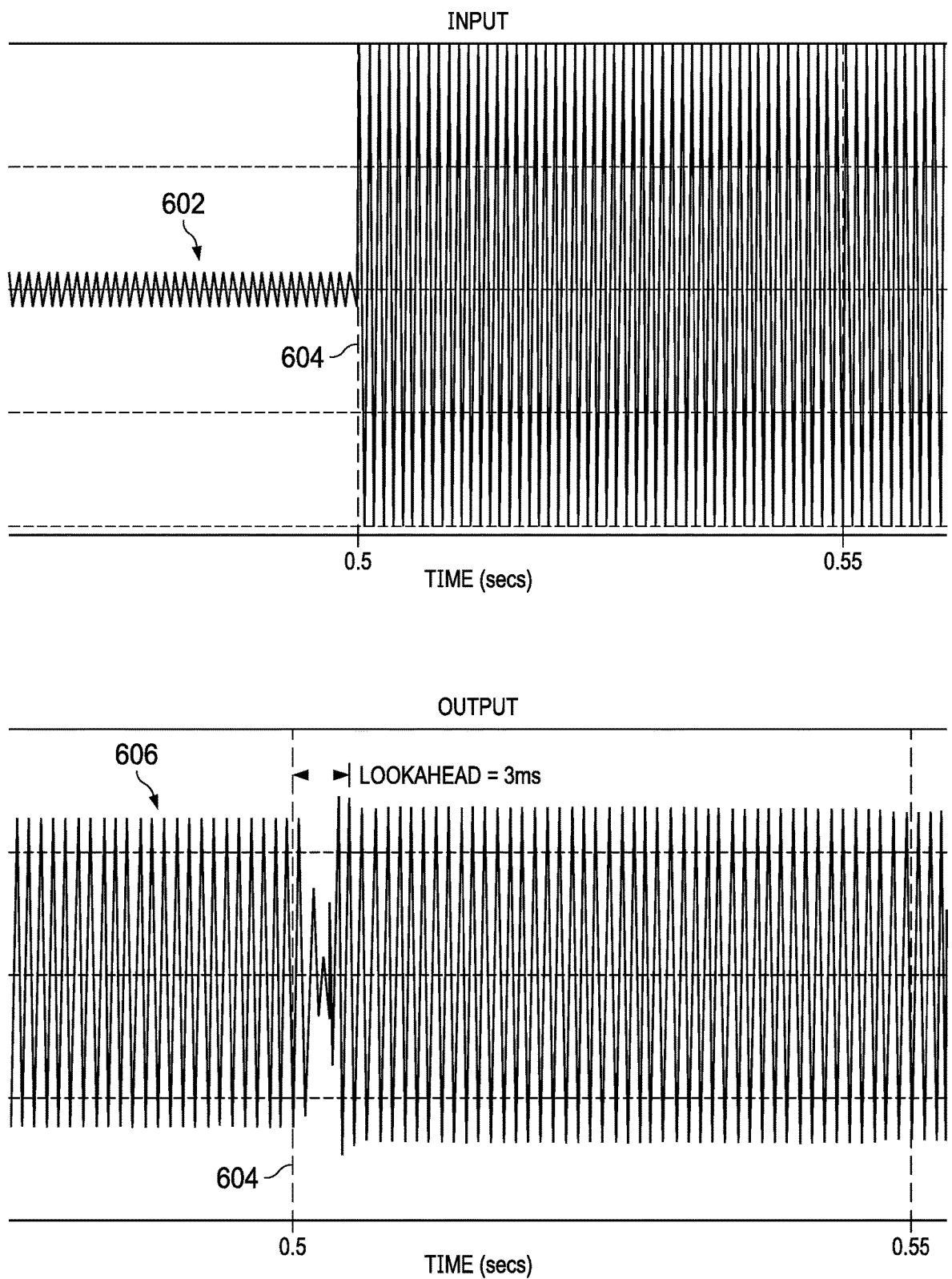
FIG. 6 shows an example of operation of an excursion control circuit in accordance with the present disclosure.

FIG. 6 shows an example of operation of the excursion control circuit excursion control circuit 402. Signal 602 is an audio input signal received by the excursion control circuit 402. At time 604, the amplitude of the 602 increases to a level that would cause over-excursion of the speaker in the speaker system 406. The signal 606 is the output of the excursion control circuit 402 (e.g., the signal provided to the amplifier 404). At time 604, the excursion control circuit 402 detects the potential over-excursion and attenuates (applies a gain attenuation to) the 602 to prevent damage to the speaker.

Some implementations of the excursion control circuit 402 omit the port detection 418, the switch 426, and/or the switch 428 if the 406 includes a passive radiator rather than a bass reflex port. Some implementations of the 402 include a digital signal processor (DSP) to provide the functions described herein. For example, a DSP executes instruction read from memory to provide the back-EMF measurement 412, the back-EMF model 414, the back-EMF model to excursion model conversion 420, and/or the excursion protection 416.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An audio circuit, comprising:
a speaker housing, comprising:
a speaker; and
a passive radiator or a bass reflex port;
an amplifier coupled to the speaker;
a voltage sensor coupled to the speaker;
a current sensor coupled to the speaker;
an excursion control circuit coupled to the amplifier, the voltage sensor, and the current sensor, the excursion control circuit comprising:
back electro-magnetic force (EMF) measurement to measure back electro-magnetic force of the speaker based on voltage measurements received from the voltage sensor and current measurements received from the current sensor;
a back-EMF model that is updated based on measurements of the back-EMF and is converted to an excursion model; and
excursion protection to limit amplitude of audio signal provided to the amplifier based on the excursion model of the speaker and amplitude of an audio input signal;
wherein the back-EMF model comprises:
a second order filter to model back-EMF of the speaker;
a fourth order filter to model back-EMF of the speaker with the passive radiator or the port;
further comprising port detection to determine whether the bass reflex port is open based on voltage measurements received from the voltage sensor and current measurements received from the current sensor.

2. The audio circuit of claim 1, wherein output of the fourth order filter is applied to estimate speaker excursion based on the bass reflex port being open, and output of the second order filter is applied to estimate speaker excursion based on the bass reflex port being closed.

3. An audio circuit, comprising:
an amplifier;
a voltage sensor coupled to an output of the amplifier;
a current sensor coupled to the output of the amplifier;
an excursion control circuit coupled to the amplifier, the voltage sensor, and the current sensor, the excursion control circuit comprising:
back electro-magnetic force (EMF) measurement to measure back electro-magnetic force of a speaker based on voltage measurements received from the voltage sensor and current measurements received from the current sensor;
a back-EMF model that is updated based on measurements of the back-EMF and is converted to an excursion model; and
excursion protection to limit amplitude of audio signal provided to the amplifier based on the excursion model of the speaker and amplitude of an audio input signal;
wherein the speaker back-EMF model comprises:
a second order filter to model back-EMF of the speaker;
a fourth order filter to model back-EMF of the speaker with a passive radiator or a bass reflex port;
further comprising port detection to determine whether the bass reflex port is open based on voltage measurements received from the voltage sensor and current measurements received from the current sensor.

4. The audio circuit of claim 3, wherein output of the fourth order filter is applied to estimate speaker excursion based on the bass reflex port being open, and output of the second order filter is applied to estimate speaker excursion based on the bass reflex port being closed.

* * * * *